(12) United States Patent
Ku et al.

(10) Patent No.: US 8,292,469 B2
(45) Date of Patent: Oct. 23, 2012

(54) LED UNIT HAVING A CONVERGING LENSE

(75) Inventors: Chin-Long Ku, Taipei Hsien (TW); Wen-Jun Duan, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 374 days.

(21) Appl. No.: 12/818,175

(22) Filed: Jun. 18, 2010

(65) Prior Publication Data

US 2011/0110102 A1 May 12, 2011

(30) Foreign Application Priority Data

Nov. 9, 2009 (CN) .......................... 2009 1 0309463

(51) Int. Cl.
*F21V 5/04* (2006.01)
(52) U.S. Cl. .................... 362/311.02; 362/326; 362/335
(58) Field of Classification Search ............. 362/311.02, 362/326, 335
See application file for complete search history.

(56) References Cited

U.S. PATENT DOCUMENTS

| 7,273,299 | B2 * | 9/2007 | Parkyn et al. ................. 362/244 |
| 7,985,009 | B2 * | 7/2011 | Ho ................................. 362/335 |
| 2010/0328958 | A1 * | 12/2010 | Zhang ....................... 362/311.02 |
| 2011/0128745 | A1 * | 6/2011 | Chen et al. ............... 362/311.02 |

* cited by examiner

*Primary Examiner* — Tracie Y Green
(74) *Attorney, Agent, or Firm* — Altis Law Group, Inc.

(57) ABSTRACT

An LED (light emitting diode) includes a light emitting chip and a lens above the chip. The lens includes a base and a convex curved circumferential surface extending upwardly from a periphery of the base toward a center of the lens. An acute angle formed between a light ray generated by the chip and projecting on a point of the convex curved circumferential surface and a main axis of the lens extending vertically from a center of the chip is smaller than that formed between the normal for the point of the convex curved circumferential surface and the main axis of the lens so that light generated by the chip is converged by the lens. A light-emission angle of the LED at 10% of a peak light intensity of the LED is ranged between 60-75 degrees from the main axis.

14 Claims, 5 Drawing Sheets

LED UNIT HAVING A CONVERGING LENSE

BACKGROUND

1. Technical Field

The disclosure relates to light emitting devices and, more particularly, to a light emitting diode (LED) unit.

2. Description of Related Art

LEDs (light emitting diodes), available since the early 1960's, have been increasingly used in a variety of application fields and are intended to be a high quality replacement for conventional light sources due to high light-emitting efficiency, environmental friendliness, and low power consumption.

A typical LED includes a light emitting chip and a lens covering directly the light emitting chip. Light emitted from the light emitting chip is adjusted by the lens within a large region. However, the light within the large region cannot satisfy a converged illumination demand. An additional lens is provided to cover the lens and the light emitting chip. The addition lens converges the light output from the lens within a small region to obtain a desired illumination effect.

However, two lenses are needed to adjust the light emitted from the light emitting chip, thus increasing the cost of the LED. In addition, the light emitted from the light emitting chip travels through such two lenses, thus inevitably resulting in a loss of light intensity.

What is needed, therefore, is an LED which can overcome the limitations described above.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
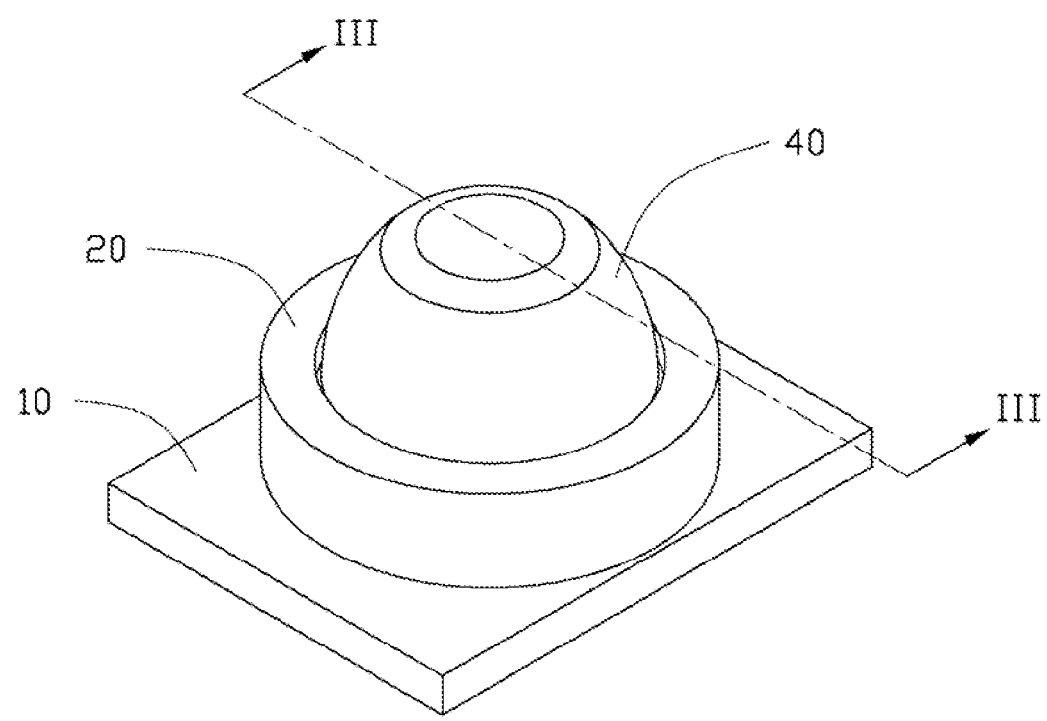
FIG. 1 is an isometric view of an LED in accordance with an embodiment of the disclosure.
Figure 2:
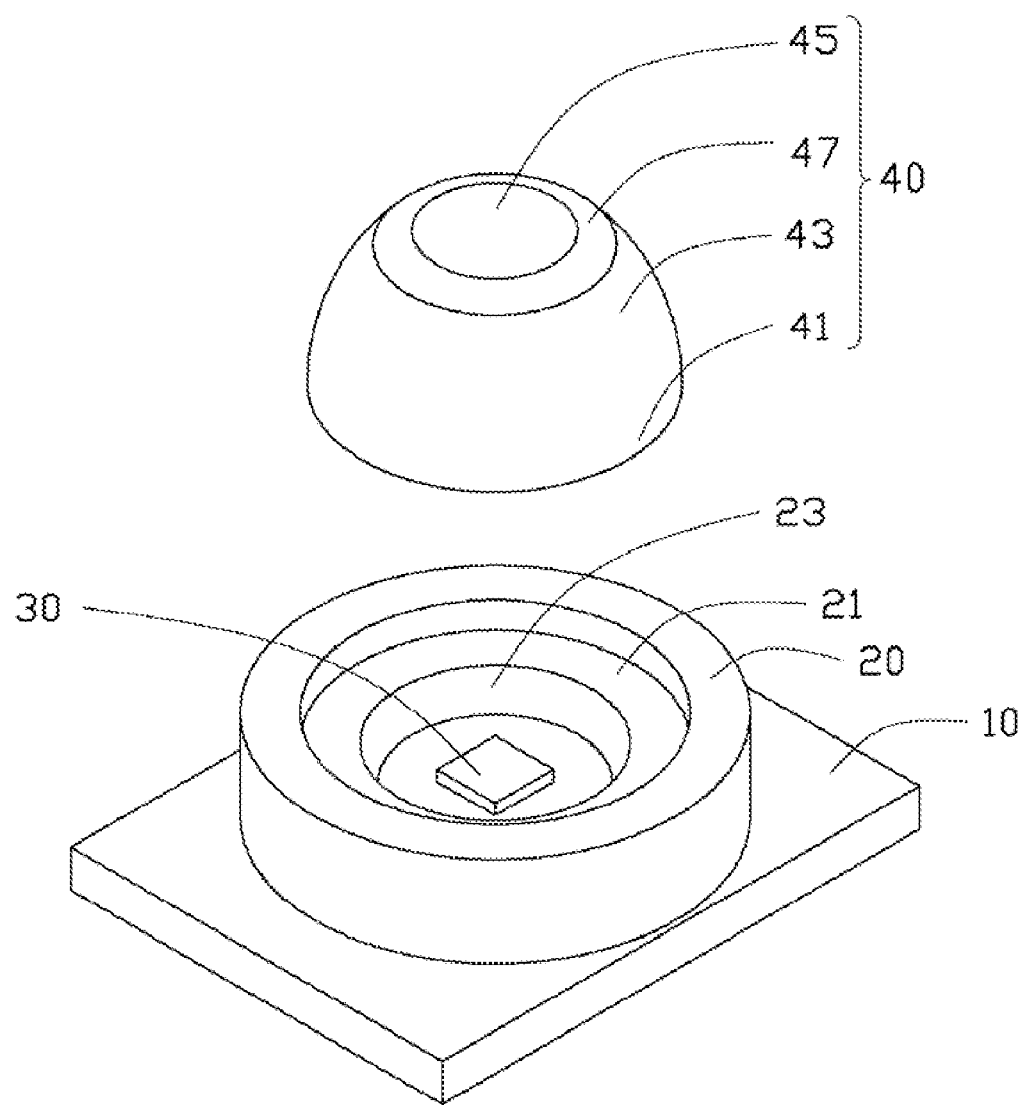
FIG. 2 is an exploded view of the LED of FIG. 1.

Referring to FIGS. 1 and 2, a light emitting diode (LED) in accordance with an embodiment of the disclosure is illustrated. The LED comprises a substrate 10, a chassis 20 mounted on a top of the substrate 10, a light emitting chip 30 received in the chassis 20 and a lens 40 mounted on a top of the chassis 20 and sealing the light emitting chip 30 in the chassis 20. The lens 40 adjusts light emitted from the light emitting chip 30.

The substrate 10 has a rectangular configuration. The chassis 20 is columnar in shape, and defines an annular step 21 recessed in the top thereof. A recess 23 is defined in a center of the annular step 21 to receive the light emitting chip 30 therein.

Figure 3:
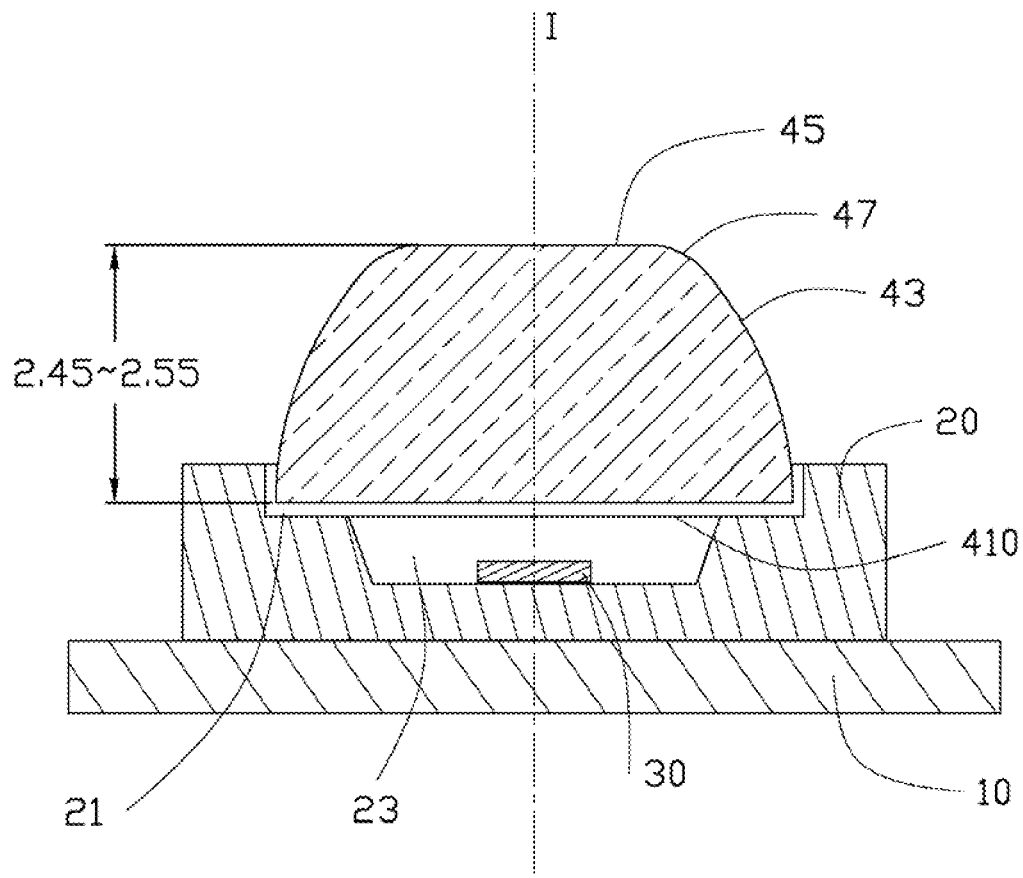
FIG. 3 shows a cross-section of the LED, taken along line of FIG. 1.

Referring also to FIG. 3, the lens 40 is made of a transparent dielectric material, such as resin, glass or silicone. The lens 40 comprises a base 41, a first curved circumferential surface 43 extending upwardly from a circumference of the base 41, a second curved circumferential surface 47 extending sequentially and upwardly from a top edge of the first curved circumferential surface 43, and a flat central surface 45 at a top of the lens 40 and surrounded by the second curved circumferential surface 47. Each of the first and second curved circumferential surfaces 43, 47 is convex towards an outside of the lens 40. The flat central surface 45, the first and second curved circumferential surfaces 43, 47 cooperatively form an outer circumferential surface of the lens 40. The outer circumferential surface is taken as a light output surface of the lens 40. The base 41 has a flat bottom surface 410 taken as a light incident surface of the lens 40 for receiving the light emitted from the light emitting chip 30. The base 41 of the lens 40 is seated on the annular step 21 of the chassis 20. A kind of glue (not shown) may be filled between the base 41 and the annular step 21 to fix the lens 40 on the chassis 20.

The first and second curved circumferential surfaces 43, 47 are centrosymmetric with respect to a main axis I of the lens 40 which extends vertically through a center of the light emitting chip 30 and a center of the lens 40.

Figure 4:
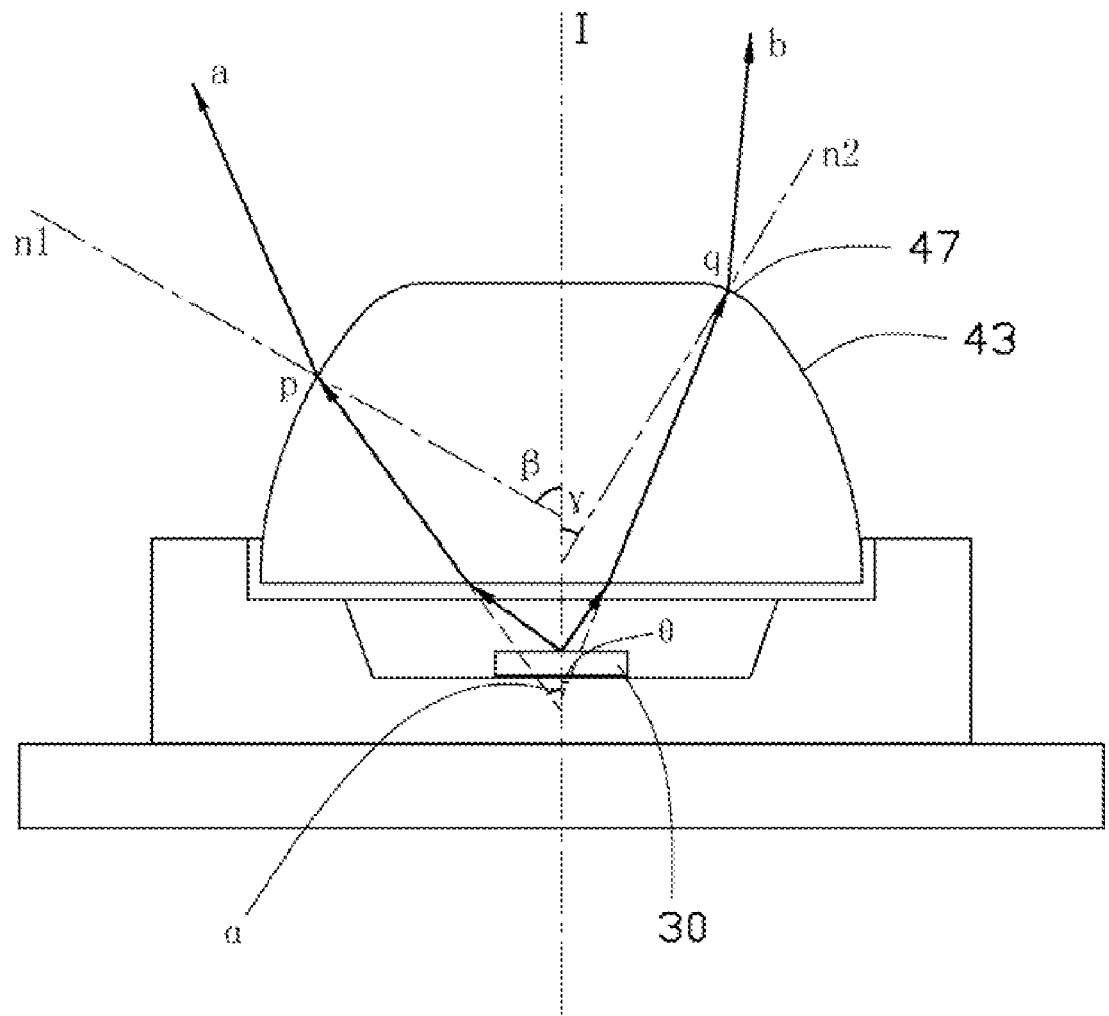
FIG. 4 is an elevational view for illustrating a refraction of light at first and second curved circumferential surfaces of a lens of the LED of FIG. 1.

Referring also to FIG. 4, an acute angle $\alpha$ formed between a light ray "a" projecting on a point "p" of the first curved circumferential surface 43 and the main axis I of the lens 40 is smaller than an acute angle $\beta$ formed between the normal n1 for the point "p" of the first curved circumferential surface 43 and the main axis I of the lens 40, whereby the light projecting on the first curved circumferential surface 43 is upwardly converged by the lens 40. An acute angle $\theta$ formed between a light ray "b" projecting on a point "q" of the second curved circumferential surface 47 and the main axis I of the lens 40 is smaller than an acute angle $\gamma$ formed between the normal n2 for the point "q" of the second curved circumferential surface 47 and the main axis I of the lens 40, whereby the light projecting on the second curved circumferential surface 47 is upwardly converged by the lens 40. A light ray projecting on the flat central surface 45 is dispersed, and an angle formed between the light ray and the main axis I of the lens 40 is controlled within an allowed range. Due to the lens 40, the light output from the lens 40 is converged within a narrow region. In this embodiment, a light-emission angle at 10% of a peak intensity of the LED is ranged between 60-75 degrees.

In this embodiment, a center of curvature of any point on the first curved circumferential surface 43 is coincidental to a corresponding point on the bottom surface 410 of the base 41, and the center of curvature is spaced a distance from a center of the bottom surface 410. A center of curvature of any point on the second curved circumferential surface 47 is coincidental to a corresponding point on the bottom surface 410 of the base 41, and the center of curvature of the second curved circumferential surface 47 is also spaced a distance from the center of the bottom surface 410.

In this embodiment, a vertical distance between the flat central surface 45 and the bottom surface 410 of the base 41 is any value between 2.45 mm and 2.55 mm. Namely, a height of the lens 40 is any value between 2.45 mm and 2.55 mm.

The first curved circumferential surface 43 has a continuous curvature radius, ranging between 2.8 mm and 4.5 mm. In other embodiments, the curvature radius of the first curved circumferential surface 43 may be any value between 2.8 mm and 4.5 mm. The second curved circumferential surface 47 has a continuous curvature radius, ranging between 0.5 mm and 1 mm. In other embodiments, the curvature radius of the second curved circumferential surface 47 may be any value between 0.5 mm and 1 mm.

Figure 5:
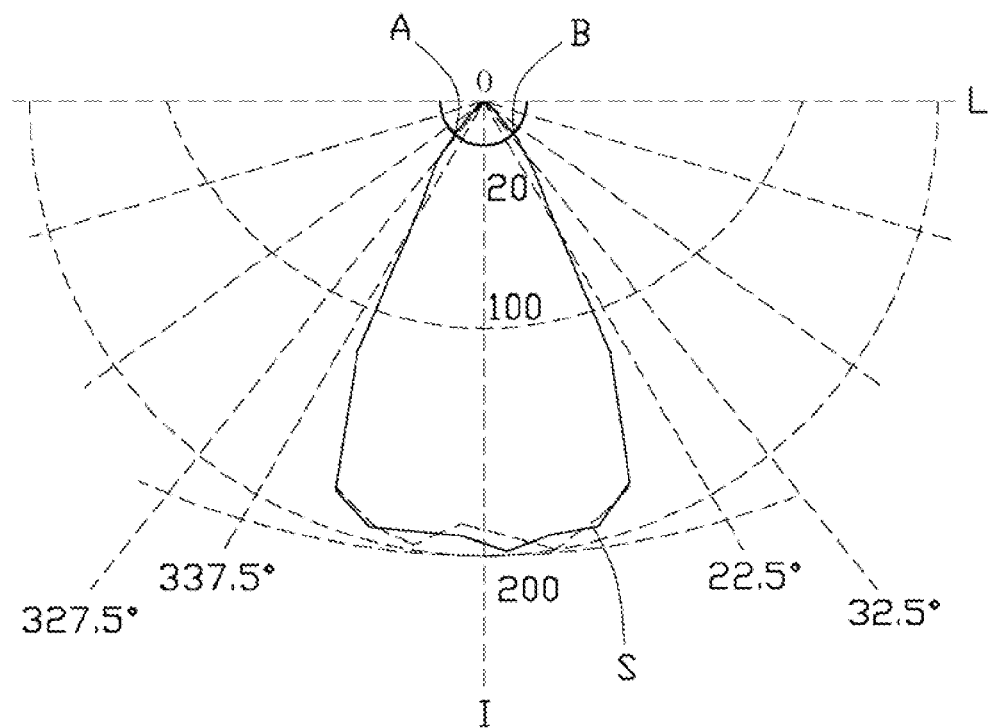
FIG. 5 is a graph of light intensity vs. angle for the LED of FIG. 1.

FIG. 5 shows a graph of light intensity vs. angle for the LED in a polar coordinate system, wherein the curvature radius of the first curved circumferential surface 43, the curvature radius of the second curved circumferential surface 47, and the height of the lens 40 are 3.37 mm, 0.7 mm, and 2.5 mm, respectively. In this graph, a horizontal line L is taken as the polar axis, and a vertical line is taken as the main axis of the lens 40. The semicircular solid line (not labeled) in this graph and the curved line S of light intensity intersect with each other at two intersecting points A and B. A radius of the semicircular solid line is 10% of the peak intensity of the LED. An angle between a straight line linking the origin O to one of the two intersecting points A and B and the main axis I of the lens 40 is a half of the light-emission angle at 10% of the peak intensity of the LED. From FIG. 5, the peak intensity of the LED is occurred near the main axis I of the lens 40, and the light-emission angle at 10% of the peak intensity of the LED is 65 degrees (i.e., an included angle between OB and OA).

It is to be understood, however, that even though numerous characteristics and advantages of various embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED (light emitting diode) comprising:
a light emitting chip; and
a lens mounted above the light emitting chip, the lens comprising a base and a convex curved circumferential surface extending upwardly from a circumferential edge of the base toward a center of the lens, an acute angle formed between a light ray generated by the light emitting chip and projecting on a point of the convex curved circumferential surface and a main axis of the lens extending vertically from a center of the light emitting chip being smaller than an acute angle formed between the normal for the point of the convex curved circumferential surface and the main axis of the lens, so that light generated by the light emitting chip and projecting on the convex curved circumferential surface is converged by the lens, a light-emission angle of the LED at 10% of a peak light intensity of the LED being ranged between 60-75 degrees deviating from the main axis of the lens.

2. The LED of claim 1, wherein a center of curvature of any point on the convex curved circumferential surface is coincidental to a corresponding point on a bottom surface of the base of the lens, and the center of curvature is spaced a distance from a center of the bottom surface.

3. The LED of claim 1, wherein the lens further comprises a flat central surface at a top thereof.

4. The LED of claim 1, wherein the convex curved circumferential surface is symmetrical with respect to the main axis of the lens.

5. The LED of claim 1, wherein a curvature radius of the convex curved circumferential surface is continuously changed between 2.8 mm and 4.5 mm or any value between 2.8 mm and 4.5 mm.

6. The LED of claim 3, wherein a vertical distance between the flat central surface and the bottom surface of the base is any value between 2.45 mm and 2.55 mm.

7. The LED of claim 3, wherein an additional convex curved circumferential surface connects the convex curved circumferential surface with the flat central surface.

8. The LED of claim 7, wherein a curvature radius of the additional convex curved circumferential surface is continuously changed between 0.5 mm and 1 mm or any value between 0.5 mm and 1 mm.

9. The LED of claim 7, wherein an acute angle formed between a light ray generated by the light emitting chip and projecting on a point of the additional convex curved circumferential surface and the main axis of the lens is smaller than that formed between the normal for the point of the additional convex curved circumferential surface and the main axis of the lens, so that light generated by the light emitting chip and projecting on the additional convex curved circumferential surface is converged by the lens.

10. The LED of claim 7, wherein a center of curvature of any point on the additional convex curved circumferential surface is coincidental to a corresponding point on the bottom surface of the base of the lens, and the center of curvature is spaced a distance from the center of the bottom surface.

11. The LED of claim 7, wherein the additional convex curved circumferential surface is symmetrical with respect to the main axis of the lens.

12. The LED of claim 7 further comprising a chassis, wherein the chassis defines a step recessed in a top thereof, a recess being defined in a center of the step to receive the light emitting chip therein.

13. The LED of claim 12, wherein the lens is seated on the step.

14. The LED of claim 13, wherein the step is annular.

* * * * *